(12) United States Patent
Sakai et al.

(10) Patent No.: US 11,270,982 B2
(45) Date of Patent: Mar. 8, 2022

(54) METHOD OF MANUFACTURING POWER SEMICONDUCTOR DEVICE AND POWER SEMICONDUCTOR DEVICE

(71) Applicant: Mitsubishi Electric Corporation, Tokyo (JP)

(72) Inventors: Norikazu Sakai, Tokyo (JP); Hiroshi Yoshida, Tokyo (JP); Hidetoshi Ishibashi, Tokyo (JP); Nobuhiro Asaji, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/473,100

(22) PCT Filed: Jan. 30, 2017

(86) PCT No.: PCT/JP2017/003137
§ 371 (c)(1),
(2) Date: Jun. 24, 2019

(87) PCT Pub. No.: WO2018/138902
PCT Pub. Date: Aug. 2, 2018

(65) Prior Publication Data
US 2019/0348404 A1    Nov. 14, 2019

(51) Int. Cl.
*H01L 25/07* (2006.01)
*H01L 21/48* (2006.01)
(Continued)

(52) U.S. Cl.
CPC ........ *H01L 25/072* (2013.01); *H01L 21/4875* (2013.01); *H01L 23/492* (2013.01);
(Continued)

(58) Field of Classification Search
None
See application file for complete search history.

(56) References Cited

U.S. PATENT DOCUMENTS 4,609,937 A * 9/1986 Takeuchi .............. H01L 23/047
174/547
7,193,318 B2 * 3/2007 Colgan ............... H01L 25/0655
257/713
(Continued)

FOREIGN PATENT DOCUMENTS

DE    11 2004 002 018 T5    10/2006
DE    11 2014 001 487 T5    12/2015
(Continued)

OTHER PUBLICATIONS

International Search Report issued in PCT/JP2017/003137; dated Apr. 11, 2017.

*Primary Examiner* — Telly D Green
(74) *Attorney, Agent, or Firm* — Studebaker & Brackett PC

(57) ABSTRACT

A metal mask is disposed on a copper base plate. A solder paste is introduced into each of a plurality of openings in the metal mask, to thereby form a pattern of the solder paste on each of copper plates of the copper base plate. A semiconductor element and a conductive component are placed on the respective patterns of the solder pastes. A metal mask is disposed on the copper base plate. Then, a solder paste is introduced into each of a plurality of openings in the metal mask, to thereby form a pattern of the solder paste covering each of the semiconductor element and the conductive component. A large-capacity relay board is disposed so as to come into contact with a corresponding pattern of the solder paste. A power semiconductor device is completed by performing heat treatment under a temperature condition of 200° C. or higher.

7 Claims, 11 Drawing Sheets

(51) Int. Cl.
  *H01L 23/492*  (2006.01)
  *H01L 23/498*  (2006.01)
  *H01L 23/00*   (2006.01)
  *H01L 25/00*   (2006.01)

(52) U.S. Cl.
  CPC ........ *H01L 23/49811* (2013.01); *H01L 24/13* (2013.01); *H01L 24/73* (2013.01); *H01L 24/91* (2013.01); *H01L 25/50* (2013.01); *H01L 2224/13155* (2013.01); *H01L 2224/73104* (2013.01); *H01L 2224/9211* (2013.01)

(56) References Cited

U.S. PATENT DOCUMENTS

| | | | |
|---|---|---|---|
| 9,972,607 B2* | 5/2018 | Zhou | H01L 24/09 |
| 10,438,932 B2* | 10/2019 | Zhou | H01L 25/0652 |
| 2002/0023341 A1 | 2/2002 | Lorenz et al. | |
| 2004/0113258 A1* | 6/2004 | Yamada | H01L 23/488 |
| | | | 257/691 |
| 2004/0140559 A1* | 7/2004 | Goller | H01L 23/5389 |
| | | | 257/734 |
| 2005/0121784 A1 | 6/2005 | Standing | |
| 2005/0189634 A1* | 9/2005 | Wakiyama | H01L 25/0655 |
| | | | 257/678 |
| 2006/0038281 A1* | 2/2006 | Colgan | H01L 25/0655 |
| | | | 257/706 |
| 2007/0216013 A1 | 9/2007 | Funakoshi et al. | |
| 2011/0267781 A1 | 11/2011 | Takayanagi et al. | |
| 2014/0264800 A1* | 9/2014 | Gowda | H01L 24/83 |
| | | | 257/675 |
| 2014/0339289 A1* | 11/2014 | Ootorii | B23K 1/20 |
| | | | 228/176 |
| 2015/0029689 A1* | 1/2015 | Imafuji | H05K 1/181 |
| | | | 361/767 |
| 2015/0084207 A1* | 3/2015 | Chauhan | H01L 24/24 |
| | | | 257/774 |
| 2016/0027711 A1 | 1/2016 | Harada | |
| 2017/0365582 A1* | 12/2017 | Seo | H01L 24/97 |
| 2018/0040593 A1* | 2/2018 | Zhou | H01L 23/5384 |

FOREIGN PATENT DOCUMENTS

| | | | | |
|---|---|---|---|---|
| JP | 2001-501376 A | | 1/2001 | |
| JP | 2002231883 A | * | 8/2002 | ............ H01L 24/32 |
| JP | 2002231883 A | | 8/2002 | |
| JP | 2006351737 A | | 12/2006 | |
| JP | 2007251076 A | | 9/2007 | |
| JP | 2010103231 A | * | 5/2010 | |
| JP | 2010103231 A | | 5/2010 | |
| JP | 2011023570 A | * | 2/2011 | ............ H01L 24/36 |
| JP | 2011023570 A | | 2/2011 | |
| JP | 2011233722 A | | 11/2011 | |
| JP | 2012129456 A | | 7/2012 | |
| JP | 5562222 B2 | | 7/2014 | |
| WO | 2013/005474 A1 | | 1/2013 | |
| WO | 2015/049944 A1 | | 4/2015 | |

\* cited by examiner

METHOD OF MANUFACTURING POWER SEMICONDUCTOR DEVICE AND POWER SEMICONDUCTOR DEVICE

TECHNICAL FIELD

The present invention relates to a method of manufacturing a power semiconductor device, and the power semiconductor device, and particularly to a method of manufacturing a power semiconductor device from which an interconnection formed by wire bonding is eliminated, and the power semiconductor device.

BACKGROUND ART

On a power semiconductor device, power semiconductor elements such as an insulated gate bipolar transistor (IGBT) and the like for example for controlling electric power, and electronic components and the like for controlling a series of operations as a power semiconductor device are mounted.

Each power semiconductor element and each electronic component are bonded to a base plate by soldering. Furthermore, a large-capacity relay board electrically connected to outside is bonded by soldering to each power semiconductor element and each electronic component that are bonded to the base plate.

In the soldering step in a process of manufacturing a power semiconductor device, ribbon solder wound in a roll shape is used. There is a patent literature (PTL) 1 as an example of the patent literature disclosing a method of boding an electronic component to a board by soldering.

CITATION LIST

Patent Literature

PTL 1: Japanese Patent Laying-Open No. 2012-129456 (Japanese Patent No. 5562222)

SUMMARY OF INVENTION

Technical Problem

As described above, in the soldering step, ribbon solder wound in a roll shape is used. In the case of the ribbon solder wound in a roll shape, the portion of the ribbon solder located closer to the center around which the solder is wound in a roll shape is more likely to undergo warpage and undulations. Accordingly, when a semiconductor element and the like are soldered, warpage or undulations in the ribbon solder should be removed. This requires a dedicated jig for cutting the ribbon solder in the state where the warpage and the like in the ribbon solder are forcibly suppressed.

Also, a dedicated jig is required for placing the cut ribbon solder on a copper plate or the like. Furthermore, when a semiconductor element or the like is placed in the state where warpage or the like remains in the cut ribbon solder, the semiconductor element or the like may tilt. When the tilt is increased, a void may be formed between the semiconductor element or the like and the copper plate.

Furthermore, for changing the thickness of the solder in accordance with the type of the semiconductor element or the like, the ribbon solder appropriate to the thickness of the solder is required, which leads to complicated management. Thus, in the case of the power semiconductor device manufactured using ribbon solder, the manufacturing process becomes complicated, which may inhibit cost reduction, shortening of the manufacturing period, and the like. Accordingly, the manufacturing process of the power semiconductor device needs to be further improved in efficiency.

The present invention has been made for the purpose of development as described above. One object of the present invention is to provide a method of manufacturing a power semiconductor device by which the manufacturing process can be improved in efficiency. Another object of the present invention is to provide the semiconductor device.

Solution to Problem

A method of manufacturing a power semiconductor device according to the present invention includes the following steps. A base plate including a first conductor plate and a second conductor plate that are electrically insulated from each other is prepared. By introducing a first solder paste into each of a plurality of first openings provided in a first mask used as a printing mask, a first portion of a first solder pattern and a second portion of the first solder pattern are formed, the first portion of the first solder pattern being in contact with the first conductor plate, and the second portion of the first solder pattern being in contact with the second conductor plate. A first semiconductor element is placed on the first portion of the first solder pattern, and a second semiconductor element is placed on the second portion of the first solder pattern. By introducing a second solder paste into each of a plurality of second openings provided in a second mask used as another printing mask, a first portion of a second solder pattern and a second portion of the second solder pattern are formed, the first portion of the second solder pattern being in contact with the first semiconductor element, and the second portion of the second solder pattern being in contact with the second semiconductor element. A relay board is disposed on the first portion of the second solder pattern and the second portion of the second solder pattern. The relay board has an external connection terminal attached thereto. Heat treatment is performed after the relay board is disposed.

Another method of manufacturing a power semiconductor device according to the present invention includes the following steps. A base plate including a first conductor plate and a second conductor plate that are electrically insulated from each other is prepared. By introducing a first solder paste into each of a plurality of first openings provided in a mask used as a printing mask, a first portion of a first solder pattern and a second portion of the first solder pattern are formed, the first portion of the first solder pattern being in contact with the first conductor plate, and the second portion of the first solder pattern being in contact with the second conductor plate. A first semiconductor element is placed on the first portion of the first solder pattern, and a second semiconductor element is placed on the second portion of the first solder pattern. A second solder paste is applied onto each of a first upper surface of the first semiconductor element and a second upper surface of the second semiconductor element, to form a first portion of a second solder pattern on the first upper surface and a second portion of the second solder pattern on the second upper surface. A relay board is disposed on the first portion of the second solder pattern and the second portion of the second solder pattern. The relay board has an external connection terminal attached thereto. Heat treatment is performed after the relay board is disposed.

A power semiconductor device according to the present invention includes a base plate, a first semiconductor element, a second semiconductor element, a relay board, and an external connection terminal. The base plate includes a first conductor plate and a second conductor plate that are electrically insulated from each other. The first semiconductor element is bonded to the first conductor plate via a first portion of a first solder pattern. The second semiconductor element is bonded to the second conductor plate via a second portion of the first solder pattern. The relay board is bonded to the first semiconductor element via a first portion of a second solder pattern and bonded to the second semiconductor element via a second portion of the second solder pattern. The external connection terminal is attached to the relay board.

Another power semiconductor device according to the present invention includes a base plate, a first semiconductor element, a second semiconductor element, a relay board, and an external connection terminal. The base plate includes a first conductor plate and a second conductor plate that are electrically insulated from each other. The first semiconductor element is bonded to the first conductor plate via a first portion of a first solder pattern. The second semiconductor element is bonded to the second conductor plate via a second portion of the first solder pattern. The relay board is bonded to the first semiconductor element via a first portion of a second solder pattern and bonded to the second semiconductor element via a second portion of the second solder pattern. The relay board has an external connection terminal attached thereto. The relay board is disposed on the first portion of the second solder pattern with the external connection terminal interposed therebetween.

Advantageous Effects of Invention

According to a method of manufacturing a power semiconductor device of the present invention, a first portion of a first solder pattern and a second portion of the first solder pattern are formed using a first mask as a printing mask, the first portion of the first solder pattern being in contact with a first conductor plate while the second portion of the first solder pattern being in contact with a second conductor plate. Furthermore, a first portion of a second solder pattern and a second portion of the second solder pattern are formed using a second mask as a printing mask, the first portion of the second solder pattern being in contact with a first semiconductor element while the second portion of the second solder pattern being in contact with a second semiconductor element. Thereby, the manufacturing process can be improved in efficiency.

According to another method of manufacturing a power semiconductor device of the present invention, a first portion of a first solder pattern and a second portion of the first solder pattern are formed using a mask as a printing mask, the first portion of the first solder pattern being in contact with a first conductor plate while the second portion of the first solder pattern being in contact with a second conductor plate. Furthermore, a second solder paste is applied onto each of a first upper surface of a first semiconductor element and a second upper surface of a second semiconductor element, to thereby form a first portion of a second solder pattern on the first upper surface and a second portion of the second solder pattern on the second upper surface. Thereby, the manufacturing process can be improved in efficiency.

According to a power semiconductor device of the present invention, by manufacturing a power semiconductor device using the above-mentioned method of manufacturing a power semiconductor device, the manufacturing process is improved in efficiency, thereby allowing contribution to production cost reduction.

According to another power semiconductor device of the present invention, by manufacturing another power semiconductor device using the above-mentioned another method of manufacturing a power semiconductor device, the manufacturing process is improved in efficiency, thereby allowing contribution to production cost reduction.

DESCRIPTION OF EMBODIMENTS

First Embodiment

Figure 1:
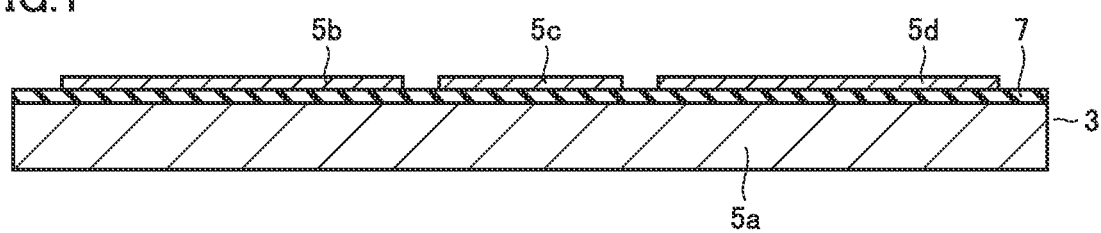
FIG. 1 is a cross-sectional view showing one step of a method of manufacturing a power semiconductor device according to the first embodiment.

An example of a method of manufacturing a power semiconductor device according to the first embodiment will be hereinafter described. As shown in FIG. 1, a copper base plate 3 is first prepared. Copper base plate 3 includes a copper plate 5a on which a plurality of copper plates 5b, 5c, and 5d are disposed with a resin insulating portion 7 interposed therebetween. Copper plates 5b, 5c and 5d are electrically insulated from each other. A semiconductor element is placed on each of the plurality of copper plates 5b, 5c and 5d.

Figure 2:
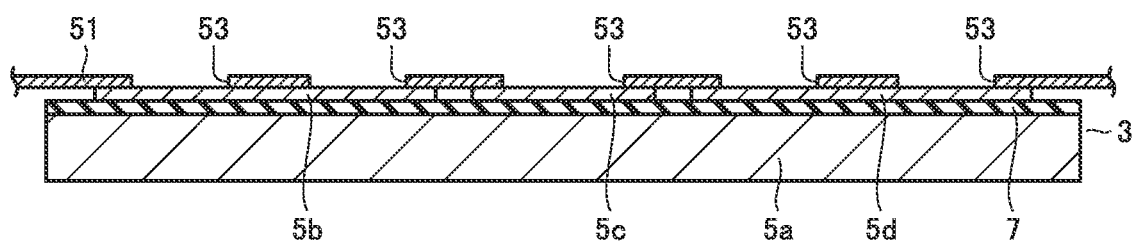
FIG. 2 is a cross-sectional view showing the step performed after the step shown in FIG. 1 in the first embodiment.

Then, a metal mask 51 (see FIG. 2) as the first mask is prepared. Metal mask 51 is provided with a plurality of openings 53. Then, as shown in FIG. 2, metal mask 51 is disposed on copper base plate 3 such that each of the plurality of openings 53 is located at the position of the semiconductor element (not shown) placed on a corresponding one of copper plates 5b, 5c and 5d.

Then, a solder paste (not shown) is applied onto metal mask 51. In this case, for example, a tin (Sn)-based solder paste complying with the Restriction of Hazardous Substances (RoHS) Directive is used as a solder paste. The RoHS Directive represents the directive on the restriction of the use of certain hazardous substances in electrical and electronic equipment issued by European Union (EC).

Figure 3:
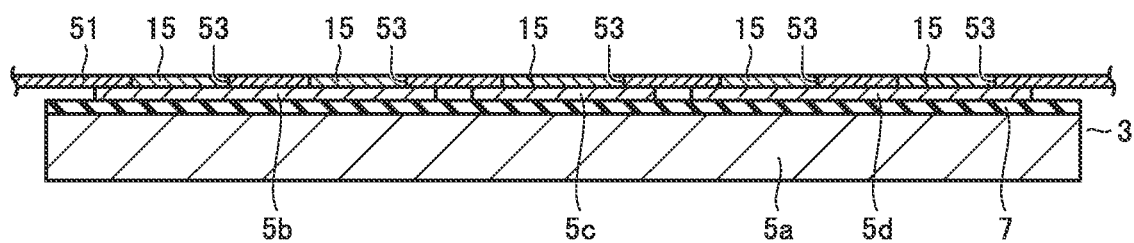
FIG. 3 is a cross-sectional view showing the step performed after the step shown in FIG. 2 in the first embodiment.
Figure 4:
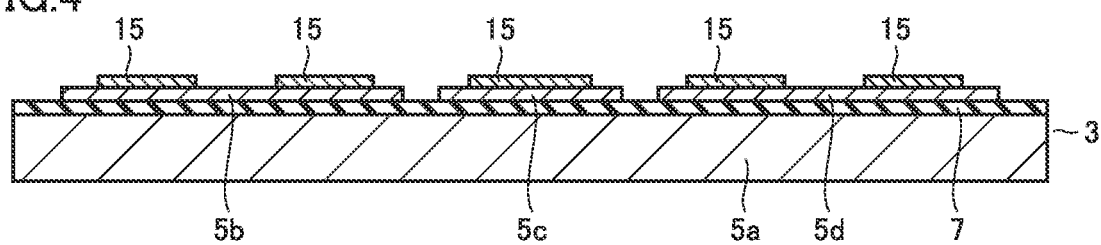
FIG. 4 is a cross-sectional view showing the step performed after the step shown in FIG. 3 in the first embodiment.

Then, for example, using a squeegee (not shown) or the like, a solder paste 15 is introduced into each of the plurality of openings 53 in metal mask 51 as shown in FIG. 3. Then, metal mask 51 is removed, with the result that a pattern of solder paste 15 is formed on each of the plurality of copper plates 5b, 5c and 5d, as shown in FIG. 4.

The pattern of solder paste 15, for example, includes a pattern of solder paste 15 as a first portion of a first solder pattern and a pattern of solder paste 15 as a second portion of the first solder pattern. The first portion of the first solder pattern is formed on copper plate 5b while the second portion of the first solder pattern is formed on copper plate 5c. The thickness of the pattern of solder paste 15 corresponds to the thickness of metal mask 51. The pattern of solder paste 15 is formed to be relatively thin in order to allow leakage of heat generated in the semiconductor element and the like to copper plates 5b, 5c and 5d and the like.

Figure 5:
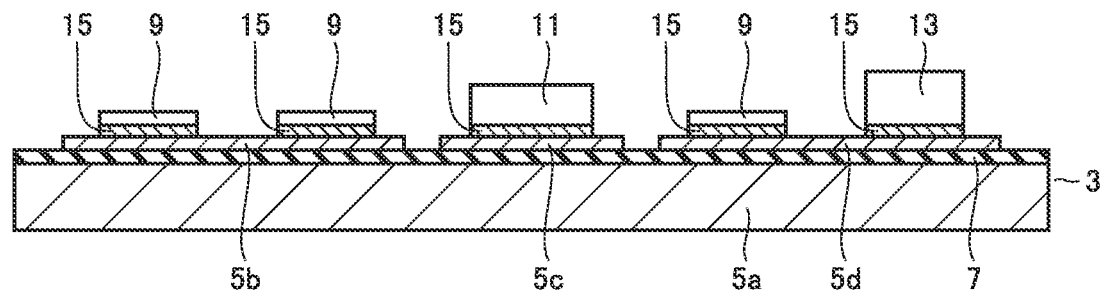
FIG. 5 is a cross-sectional view showing the step performed after the step shown in FIG. 4 in the first embodiment.

Then, as shown in FIG. 5, semiconductor elements 9, 11 and a conductive component 13 are placed on the respective patterns of predetermined specific solder pastes 15. Each of semiconductor elements 9 and 11 includes an IGBT, for example.

Figure 6:
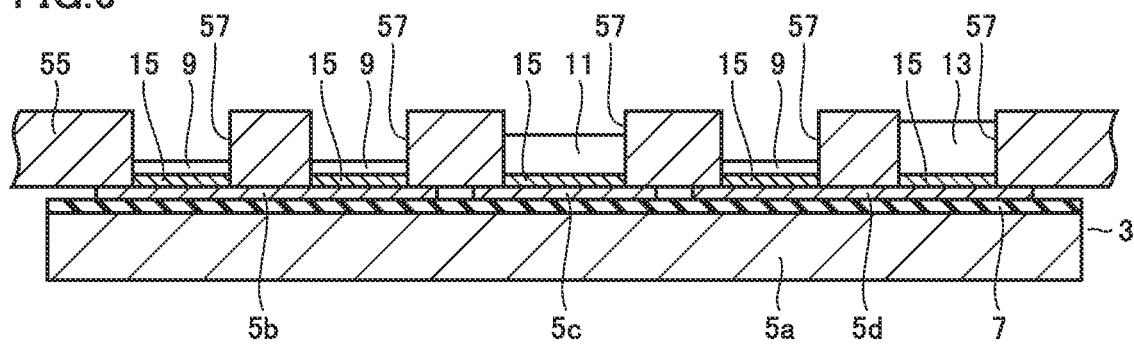
FIG. 6 is a cross-sectional view showing the step performed after the step shown in FIG. 5 in the first embodiment.

Then, a metal mask 55 (see FIG. 6) as the second mask is prepared. Metal mask 55 is provided with a plurality of openings 57. Then, as shown in FIG. 6, metal mask 55 is disposed on copper base plate 3 such that each of semiconductor elements 9, 11 and conductive component 13 is fitted into a corresponding one of the plurality of openings 57.

Figure 7:
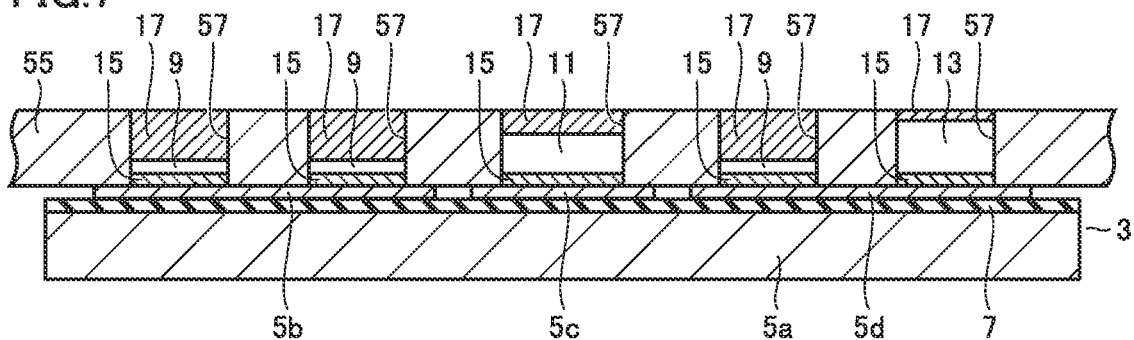
FIG. 7 is a cross-sectional view showing the step performed after the step shown in FIG. 6 in the first embodiment.
Figure 8:
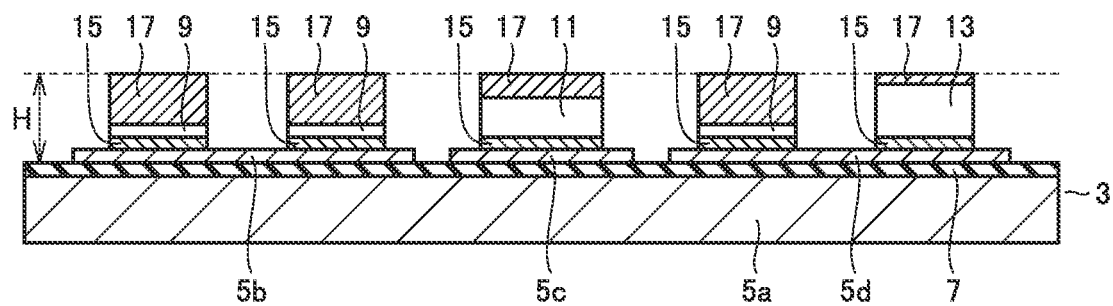
FIG. 8 is a cross-sectional view showing the step performed after the step shown in FIG. 7 in the first embodiment.

Then, a solder paste (not shown) is applied onto metal mask 55. Then, for example, using a squeegee (not shown) or the like, a solder paste 17 is introduced into each of the plurality of openings 57 in metal mask 55 as shown in FIG. 7. Then, metal mask 55 is removed, with the result that a pattern of solder paste 17 is formed to cover each of semiconductor elements 9, 11 and conductive component 13 as shown in FIG. 8.

Solder paste 17 covering semiconductor element 9 is relatively thick while solder paste 17 covering semiconductor element 11 and solder paste 17 covering conductive component 13 are relatively thin. Although some of solder pastes 17 do not have the same thickness, the positions (height H) of the upper surfaces of the patterns of solder pastes 17 are aligned at the same height.

The patterns of solder pastes 17 include for example: a pattern of solder paste 17 as a first portion of a second solder pattern formed so as to cover semiconductor element 9; and a pattern of solder paste 17 as a second portion of the second solder pattern formed so as to cover semiconductor element 11.

Figure 9:
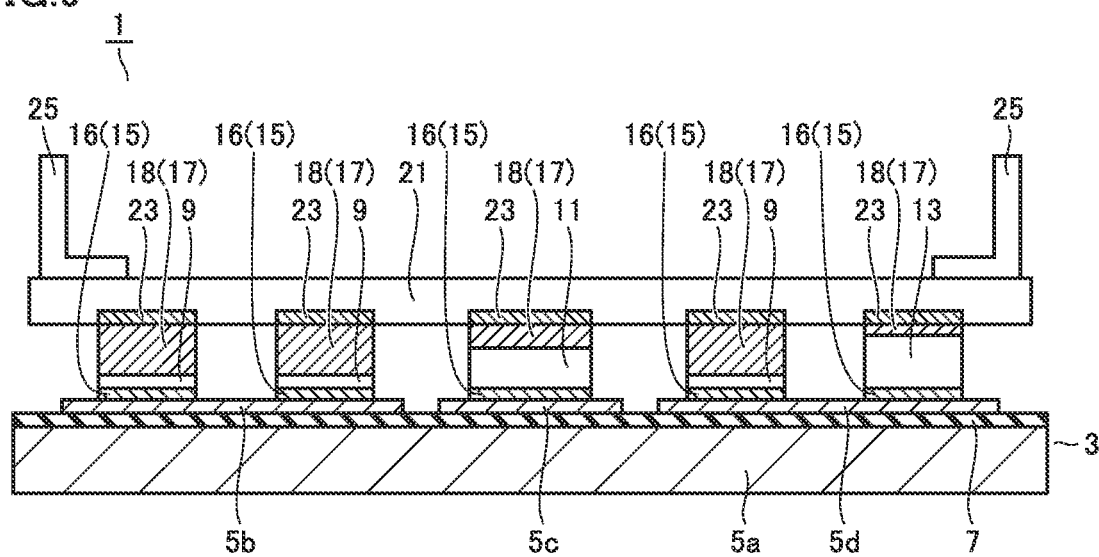
FIG. 9 is a cross-sectional view showing the step performed after the step shown in FIG. 8 in the first embodiment.

Then, a large-capacity relay board 21 is placed as shown in FIG. 9. Large-capacity relay board 21 is provided with a plurality of conductor portions 23. The plurality of conductor portions 23 are disposed at the respective positions of the patterns of solder pastes 17. Large-capacity relay board 21 is disposed such that each of the plurality of conductor portions 23 comes into contact with a corresponding one of solder pastes 17.

A plurality of external connection terminals 25 are attached to large-capacity relay board 21. Each of the plurality of external connection terminals 25 is electrically connected via conductor portion 23 and solder paste 17 to a corresponding one of semiconductor elements 9, 11 and conductive component 13. Then, for example, an oxide film covering solder pastes 15, 17 and the like is removed in a reducing atmosphere at a temperature of 150° C. or higher. Then, heat treatment is performed under the decompression condition at a temperature of 200° C. or higher, thereby melting solder pastes 15 and 17 while suppressing formation of voids.

Thereby, semiconductor element 9 is bonded to copper plates 5b and 5d via solder 16 (solder paste 15) and bonded to conductor portion 23 via solder 18 (solder paste 17). Semiconductor element 11 is bonded to copper plate 5c via solder 16 (solder paste 15) and bonded to conductor portion 23 via solder 18 (solder paste 17). Conductive component 13 is bonded to copper plate 5d via solder 16 (solder paste 15) and bonded to conductor portion 23 via solder 18 (solder paste 17).

Thus, a main part of power semiconductor device 1 is completed. In this power semiconductor device 1, each of semiconductor elements 9, 11 and conductive component 13 is electrically connected to external connection terminal 25 via large-capacity relay board 21 without having to form an interconnection by wire bonding.

According to the method of manufacturing a power semiconductor device 1 as described above, each of semiconductor elements 9, 11 and conductive component 13 is bonded to copper base plate 3 and large-capacity relay board 21 via solder pastes 15 and 17 printed using metal masks 51 and 55, respectively, as printing masks. This eliminates the necessity of a dedicated jig for forcibly suppressing warpage of the ribbon solder, as compared with the bonding method performed using ribbon solder. Furthermore, a dedicated jig for placing the cut ribbon solder on a copper base plate or the like is also not required. As a result, a power semiconductor device can be efficiently manufactured, thereby allowing contribution to cost reduction and shortening of the manufacturing period.

Furthermore, the thicknesses of solder pastes 15 and 17 can be adjusted by the respective thicknesses of metal masks 51 and 55. Thus, as compared with the case where the thickness of the solder is changed by the thickness of the ribbon solder, the thickness of solder can be readily changed, thereby allowing contribution to a further improvement in efficiency of the manufacturing process of the power semiconductor device.

Furthermore, even when semiconductor elements 9, 11 and conductive component 13 are different in thickness from each other, the height of solder 18 (solder paste 17) is to be defined by the thickness of metal mask 55. Thereby, large-capacity relay board 21 can be disposed at an approximately constant height without being tilted with respect to copper base plate 3.

Second Embodiment

The first embodiment has been described with regard to an example of the method of manufacturing a power semiconductor device including one large-capacity relay board. In contrast, an example of a method of manufacturing a power semiconductor device including two large-capacity relay boards will be hereinafter described. The same components as those described in the first embodiment will be designated by the same reference characters, and the description thereof will not be repeated unless otherwise required.

Figure 10:
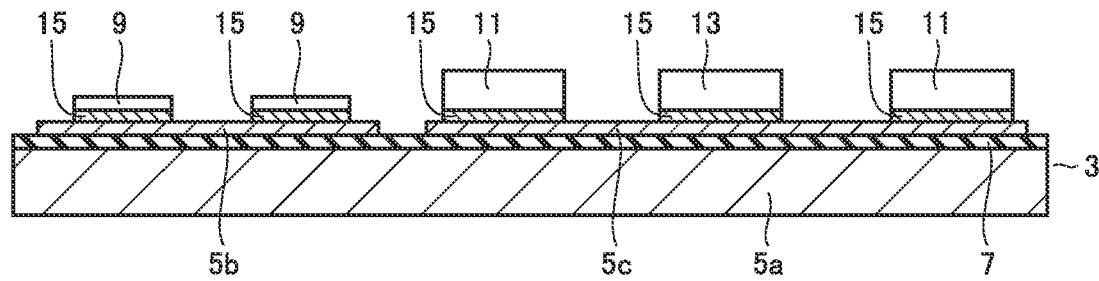
FIG. 10 is a cross-sectional view showing one step of a method of manufacturing a power semiconductor device according to the second embodiment.

First, copper base plate 3 is prepared. Copper base plate 3 includes copper plate 5a on which a plurality of copper plates 5b and 5c are disposed with resin insulating portion 7 interposed therebetween (see FIG. 10). Then, a pattern of solder paste 15 is formed on each of the plurality of copper plates 5b and 5c through the same steps as those shown in FIGS. 2, 3 and 4 (see FIG. 10). Then, semiconductor elements 9, 11 and conductive component 13 are placed on the respective patterns of predetermined specific solder pastes 15, as shown in FIG. 10.

Figure 11:
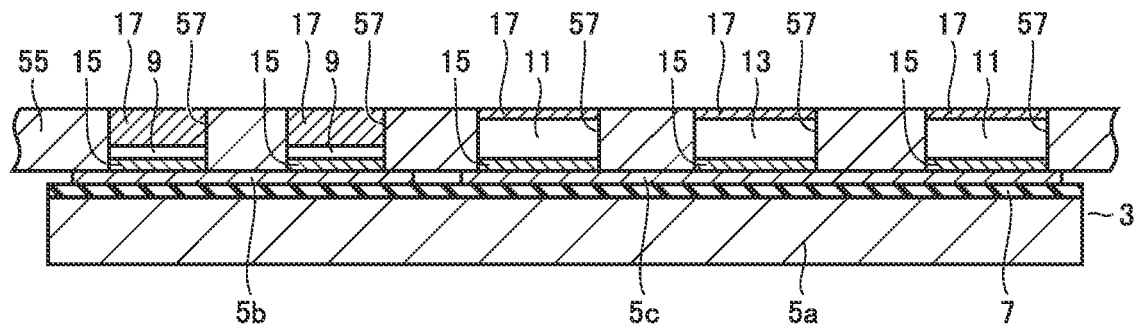
FIG. 11 is a cross-sectional view showing the step performed after the step shown in FIG. 10 in the second embodiment.

Then, a metal mask 55 (see FIG. 11) is prepared. Metal mask 55 is provided with a plurality of openings 57. Then, as shown in FIG. 11, metal mask 55 is disposed on copper base plate 3 such that each of semiconductor elements 9, 11 and conductive component 13 is fitted into a corresponding one of openings 57.

Then, a solder paste (not shown) is applied onto metal mask 55. Then, solder paste 17 is introduced into each of the plurality of openings 57 in metal mask 55, for example, using a squeegee (not shown) or the like. Then, metal mask 55 is removed, with the result that a pattern of solder paste 17 is formed so as to cover each of semiconductor elements 9, 11 and conductive component 13. Although some of solder pastes 17 do not have the same thickness, the positions (height H) of the upper surfaces of the patterns of solder pastes 17 are aligned at the same height.

Figure 12:
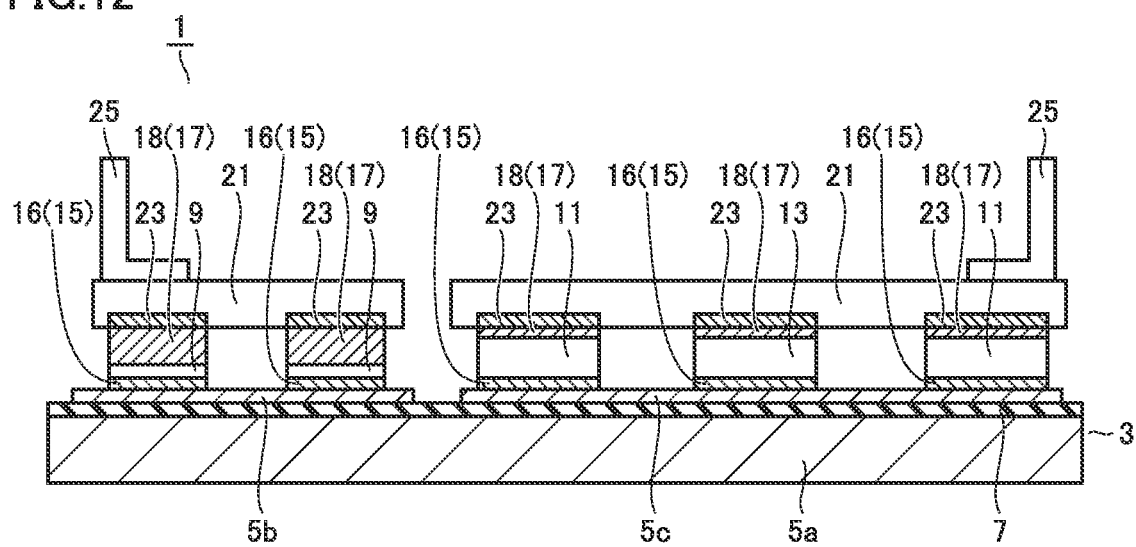
FIG. 12 is a cross-sectional view showing the step performed after the step shown in FIG. 11 in the second embodiment.

Then, two large-capacity relay boards 21 are placed as shown in FIG. 12. One of two large-capacity relay boards 21 is disposed such that each of the plurality of conductor portions 23 comes into contact with the pattern of solder paste 17 covering a corresponding one of semiconductor elements 9. The other one of two large-capacity relay boards 21 is disposed such that each of the plurality of conductor portions 23 comes into contact with the pattern of solder paste 17 covering a corresponding one of semiconductor element 11 and conductive component 13.

Then, the oxide film covering solder pastes 15, 17 and the like is removed in a reducing atmosphere at a temperature of 150° C. or higher, as in the step shown in FIG. 9. Then, heat treatment is performed under the decompression condition at a temperature of 200° C. or higher, thereby melting solder pastes 15 and 17 while suppressing formation of voids.

Thereby, semiconductor element 9 is bonded to copper plate 5b via solder 16 (solder paste 15) and bonded to conductor portion 23 via solder 18 (solder paste 17). Semiconductor element 11 is bonded to copper plate 5c via solder 16 (solder paste 15) and bonded to conductor portion 23 via solder 18 (solder paste 17). Conductive component 13 is bonded to copper plate 5c via solder 16 (solder paste 15) and bonded to conductor portion 23 via solder 18 (solder paste 17).

Thus, a main part of power semiconductor device 1 is completed. In this power semiconductor device 1, semiconductor element 9 is electrically connected to external connection terminal 25 via one of two large-capacity relay boards 21 without having to form an interconnection by wire bonding. Furthermore, each of semiconductor element 11 and conductive component 13 is electrically connected to external connection terminal 25 via the other one of two large-capacity relay boards 21 without having to form an interconnection by wire bonding.

In the above-described method of manufacturing a power semiconductor device, each of semiconductor elements 9, 11 and conductive component 13 is bonded to copper base plate 3 and large-capacity relay board 21 via solder 16 and solder 18 (solder paste 15 and solder paste 17). Thereby, in the same way as described in the first embodiment, power semiconductor device 1 can be efficiently manufactured to thereby allow contribution to cost reduction and shortening of the manufacturing period, as compared with the bonding method performed using ribbon solder.

Also, the thickness of solder paste 17 can be adjusted by the thickness of metal mask 55 or the like. Thereby, as compared with the case where the thickness of solder is changed by the thickness of ribbon solder, the thickness of solder can be readily changed, thereby allowing contribution to a further improvement in efficiency of the manufacturing process of the power semiconductor device.

Furthermore, even when semiconductor elements 9, 11 and conductive component 13 are different in thickness from each other, the height of solder 18 (solder paste 17) is defined by the thickness of metal mask 55. Thereby, two large-capacity relay boards 21 can be disposed at an approximately constant height without being tilted with respect to copper base plate 3.

Third Embodiment

Then, an explanation will be given with regard to an example of a method of manufacturing a power semiconductor device in which solder portions covering semiconductor elements and the like are different in height. The same components as those described in the first embodiment will be designated by the same reference characters, and the description thereof will not be repeated unless otherwise required.

Figure 13:
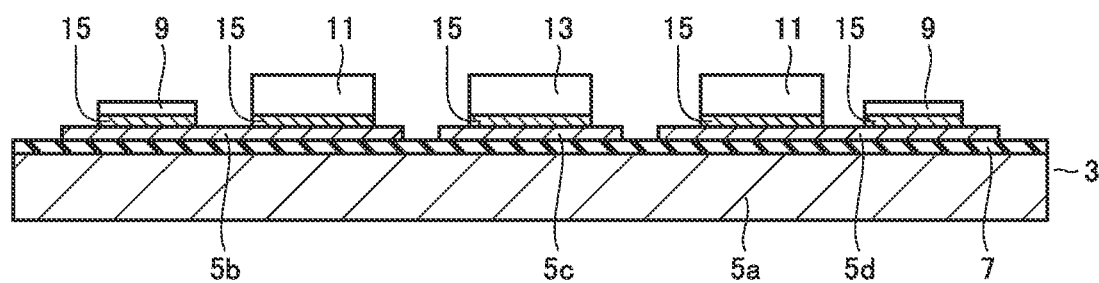
FIG. 13 is a cross-sectional view showing one step of a method of manufacturing a power semiconductor device according to the third embodiment.

First, copper base plate 3 is prepared. Copper base plate 3 includes copper plate 5a on which a plurality of copper plates 5b, 5c, and 5d are disposed with resin insulating portion 7 interposed therebetween (see FIG. 13). Then, a pattern of solder paste 15 is formed on each of the plurality of copper plates 5b, 5c and 5d through the same steps as those shown in FIGS. 2, 3 and 4 (see FIG. 13). Then, semiconductor elements 9, 11 and conductive component 13 are placed on the respective patterns of predetermined specific solder pastes 15, as shown in FIG. 13.

Figure 14:
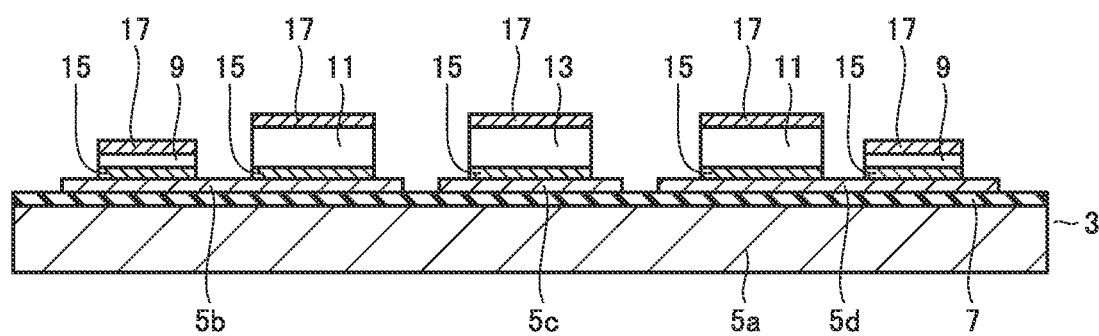
FIG. 14 is a cross-sectional view showing the step performed after the step shown in FIG. 13 in the third embodiment.

Then, as shown in FIG. 14, drops of the solder paste are applied by a dispenser onto the upper surface of each of semiconductor elements 9, 11 and conductive component 13 (potting). At this time, the amount of drops of the solder paste is adjusted based on the area and the thickness of the region on which the solder paste is disposed.

In this case, the amount of solder paste 17 is adjusted, for example, such that solder paste 17 having the same thickness is formed on each of semiconductor elements 9, 11 and conductive component 13. Accordingly, the height of solder paste 17 formed on the upper surface of semiconductor element 9 is lower than the height of solder paste 17 formed on the upper surface of each of semiconductor element 11 and conductive component 13.

Figure 15:
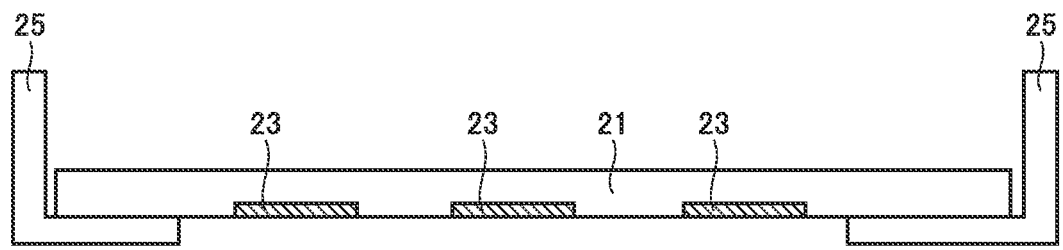
FIG. 15 is a cross-sectional view showing the step performed after the step shown in FIG. 14 in the third embodiment.

Then, large-capacity relay board 21 is prepared as shown in FIG. 15. In this case, external connection terminal 25 is connected to large-capacity relay board 21 on the side facing copper base plate 3, and disposed so as to protrude in the direction opposite to the side facing copper base plate 3.

Figure 16:
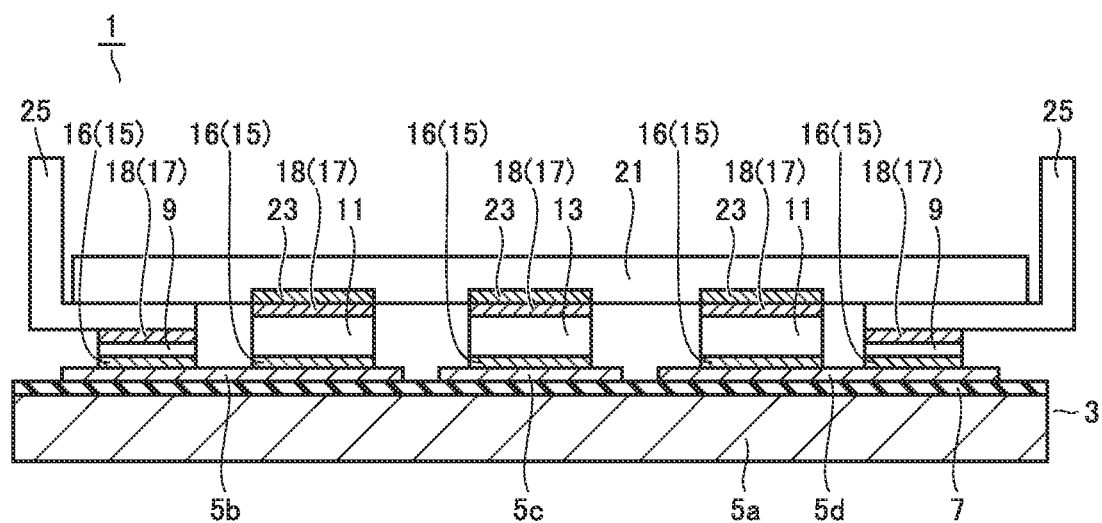
FIG. 16 is a cross-sectional view showing the step performed after the step shown in FIG. 15 in the third embodiment.

Then, as shown in FIG. 16, large-capacity relay board 21 is placed. In this case, large-capacity relay board 21 is placed in such a manner that the plurality of conductor portions 23 come into contact with the respective patterns of solder pastes 17 covering semiconductor element 11 and conductive component 13, and that external connection terminal 25 comes into contact with the pattern of solder paste 17 covering semiconductor element 9. Thereby, an electrical connection is established between large-capacity relay board 21 (external connection terminal 25) and the pattern of solder paste 17 covering semiconductor element 9 located lower than the patterns (the upper surfaces) of solder pastes 17 covering semiconductor element 11 and the like.

Then, the oxide film covering solder pastes 15, 17 and the like is removed in a reducing atmosphere at a temperature of 150° C. or higher, as in the step shown in FIG. 9. Then, heat treatment is performed under the decompression condition at a temperature of 200° C. or higher, thereby melting solder pastes 15 and 17 while suppressing formation of voids.

Thereby, semiconductor element 9 is bonded to copper plates 5b and 5d via solder 16 (solder paste 15) and bonded to external connection terminal 25 via solder 18 (solder paste 17). Semiconductor element 11 is bonded to copper plates 5b and 5c via solder 16 (solder paste 15) and bonded to conductor portion 23 via solder 18 (solder paste 17). Conductive component 13 is bonded to copper plate 5c via solder 16 (solder paste 15) and bonded to conductor portion 23 via solder 18 (solder paste 17).

Thus, a main part of power semiconductor device 1 is completed. In this power semiconductor device 1, semiconductor element 9 is electrically directly connected to external connection terminal 25 (an external connection terminal A) without having to form an interconnection by wire bonding. Each of semiconductor element 11 and conductive component 13 is electrically connected to the external connection terminal (not shown) other than external connection terminal A via large-capacity relay board 21 without having to form an interconnection by wire bonding.

According to the above-described method of manufacturing a power semiconductor device, each of semiconductor elements 9, 11 and conductive component 13 is bonded with solder 16 and solder 18 (solder pastes 15 and 17) to copper base plate 3 and large-capacity relay board 21. Thereby, in the same way as described in the first embodiment, power semiconductor device 1 can be efficiently manufactured to thereby allow contribution to cost reduction and shortening of the manufacturing period, as compared with the bonding method performed using ribbon solder.

Also, even when the height of solder paste 17 covering semiconductor element 9 is lower than the height of solder paste 17 covering semiconductor element 11 and the like, external connection terminal 25 is interposed between semiconductor element 9 and large-capacity relay board 21, so that semiconductor element 9 and external connection terminal 25 can be electrically connected to each other. Furthermore, by adjusting the amount of drops (the thickness) of solder paste 17 applied by a dispenser onto semiconductor element 9, semiconductor element 9 and external connection terminal 25 can be reliably bonded to each other. Furthermore, semiconductor element 9 and large-capacity relay board 21 can also be electrically connected through external connection terminal 25.

(Other Advantages Achieved Using Solder Paste)

In each of the above-described embodiments, the patterns of solder pastes 15 and 17 are formed by printing. Specifically, a solder paste is introduced into each of openings 53 and 57 in respective metal masks 51 and 55, thereby forming patterns of solder pastes 15 and 17 corresponding to the shapes of respective openings 53 and 57, and corresponding to the thicknesses of respective metal masks 51 and 55.

Figure 17:
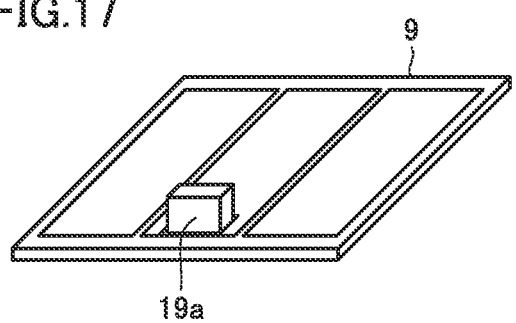
FIG. 17 is the first partial perspective view for illustrating an advantage of a manufacturing method by using a solder paste in each embodiment.

As semiconductor element 9, a small signal pad is provided as a pad of a signal system or a pad such as a gate drive unit, for example, in the case of an IGBT. The small signal pad also occupies a relatively small area. As shown in FIG. 17, by using a metal mask, the pattern of a solder paste 19a can be formed also on such a small signal pad simultaneously with formation of the pattern of the solder paste (not shown) formed on the portion other than the small signal pad.

Thereby, the small signal pad and the large-capacity relay board (the external connection terminal) can be electrically connected to each other with solder (the pattern of the solder paste), thereby allowing contribution to a reduction in size of the package of the power semiconductor device, for example, as compared with the case of electrical connection by wire bonding.

Furthermore, by adjusting the opening area and the thickness of the metal mask when the pattern of the solder paste is formed on the small signal pad, the height of the pattern of the solder paste can be changed without changing the amount of the solder paste.

Figure 18:
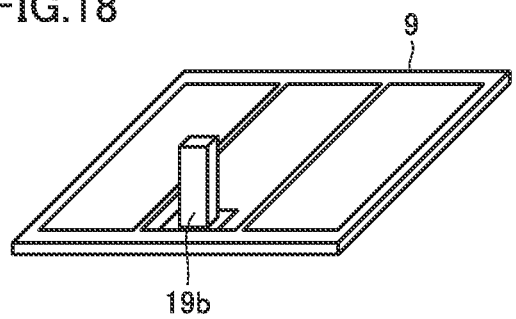
FIG. 18 is the second partial perspective view for illustrating an advantage of the manufacturing method by using a solder paste in each embodiment.

By forming the metal mask to have an increased opening area and a reduced thickness, the pattern of solder paste 19a having a relatively reduced height can be formed as shown in FIG. 17. On the other hand, by forming the metal mask to have a reduced opening area and an increased thickness, the pattern of solder paste 19b having a relatively increased height can be formed as shown in FIG. 18.

Figure 19:
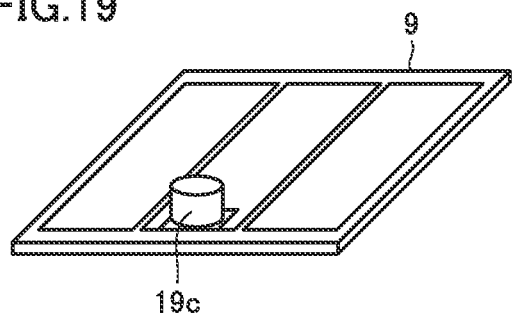
FIG. 19 is the third partial perspective view for illustrating an advantage of the manufacturing method by using a solder paste in each embodiment.
Figure 20:
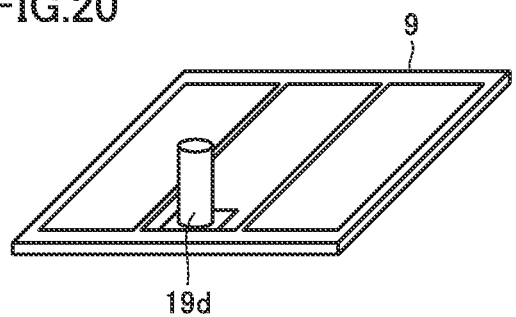
FIG. 20 is the fourth partial perspective view for illustrating an advantage of the manufacturing method by using a solder paste in each embodiment.

Furthermore, the metal mask can be formed to have an opening, for example, having a circular shape in addition to a rectangular shape. By forming the metal mask to have a circular opening and a reduced thickness, the pattern of a solder paste 19c having an approximately cylindrical shape and a relatively reduced height can be formed as shown in FIG. 19. On the other hand, by forming the metal mask to have a circular opening and an increased thickness, the pattern of a solder paste 19d having an approximately cylindrical shape and a relatively increased height can be formed as shown in FIG. 20.

In this way, by forming the metal mask to have a circular opening, approximately cylindrical solder pastes 19c, 19d are formed. This eliminates the corner as a starting point at which cracking occurs in the solder (solder pastes 19c and 19d), thereby allowing contribution to an improvement in reliability of power semiconductor device 1.

Figure 21:
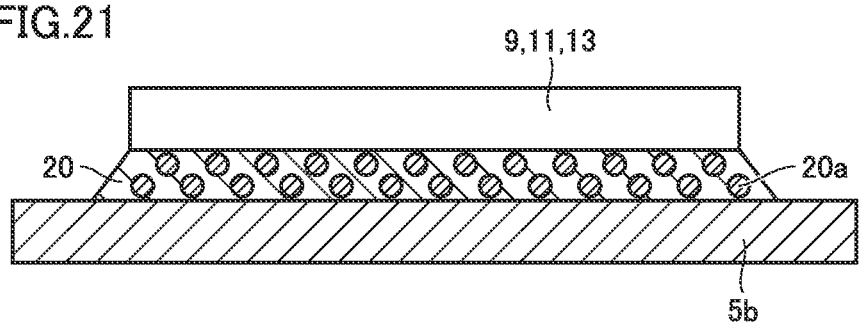
FIG. 21 is a partial cross-sectional view showing the case where solder containing nickel balls is used, for illustrating an advantage of the manufacturing method by using a solder paste in each embodiment.

Furthermore, for example, a solder paste containing nickel balls may also be used as a solder paste. In this case, as shown in FIG. 21, nickel balls 20a contained in solder paste 20 are interposed, for example, between copper base plate 3 and semiconductor elements 9, 11 or conductive component 13. Thereby, semiconductor elements 9, 11 or conductive component 13 can be prevented from tilting with respect to copper plate 5b (the copper base plate). Furthermore, by interposing the solder containing nickel balls between the large-capacity relay board (not shown) and semiconductor elements 9, 11 and the like, the tilt of the large-capacity relay board with respect to copper plate 5b (the copper base plate) can be reliably suppressed.

Each of the above embodiments has been described with reference to an example of solder pastes 17 having the same thickness regarding the thicknesses of solder pastes 17 covering semiconductor elements 9, 11 and conductive component 13. The solder pastes do not necessarily have to have the same thickness, but the solder pastes having different thicknesses may be formed as required. For example, a pattern of a specific solder paste is formed using a printing mask, and thereafter, a pattern of another specific solder paste is formed using a dispenser, so that patterns of solder pastes having different thicknesses can be formed.

Also, a tin-based solder paste has been described by way of example as a solder paste. As such a solder paste, an unwashed solder paste manufactured by Senju Metal Industry Co., Ltd. may be used. By using such an unwashed solder paste, a flux residue is reduced, so that the leakage thereof can be avoided.

Furthermore, solder pastes having different compositions may be applied as solder pastes. For example, by using an Sn—Ag—Cu—Sb-based solder paste as solder paste 15 used for bonding semiconductor elements 9, 11 and the like to copper base plate 3, cracking resulting from the temperature cycle can be suppressed. On the other hand, by using an Sn—Cu-based solder paste as solder paste 17 used for bonding large-capacity relay board 21 to semiconductor elements 9, 11 and the like, the cost can be reduced.

Furthermore, for example, the composition of solder paste 15 used for bonding semiconductor element 9 to copper base plate 3 may be different from the composition of solder paste 15 used for bonding semiconductor element 11 to copper base plate 3, as required. Also similarly, the composition of solder paste 17 used for bonding large-capacity relay board 21 to semiconductor element 9 may be different from the composition of solder paste 17 used for bonding large-capacity relay board 21 to semiconductor element 11, as required.

The methods of manufacturing a power semiconductor device having been described in the above embodiments can be variously combined with each other as appropriate.

The embodiments disclosed herein are merely by way of example and not limited thereto. The scope of the present invention is defined by the terms of the claims, rather than the description above, and is intended to include any modifications within the meaning and scope equivalent to the terms of the claims.

INDUSTRIAL APPLICABILITY

The present invention is effectively utilized for a power semiconductor device in which an interconnection by wire bonding is not formed.

REFERENCE SIGNS LIST 1 power semiconductor device, 3 copper base plate, 5a, 5b, 5c, 5d copper plate, 7 resin insulating portion, 9, 11 semiconductor element, 13 conductive component, 15, 17, 19a, 19b, 19c, and 19d solder paste, 16, 18 solder, 20 solder paste containing nickel balls, 20a nickel ball, 21 large-capacity relay board, 23 conductor portion, 25 external connection terminal, 51, 55 metal mask, 53, 57 opening.

The invention claimed is:

1. A method of manufacturing a power semiconductor device, the method comprising:
preparing a base plate including a first conductor plate and a second conductor plate that are electrically insulated from each other;
by introducing a first solder paste into each of a plurality of first openings provided in a mask used as a printing mask, forming a first portion of a first solder pattern and a second portion of the first solder pattern, the first portion of the first solder pattern being in contact with the first conductor plate, and the second portion of the first solder pattern being in contact with the second conductor plate;
placing a first semiconductor element directly on the first portion of the first solder pattern, and placing a second semiconductor element directly on the second portion of the first solder pattern, the first semiconductor element being designed to have a thickness different from a thickness of the second semiconductor element;
applying a second solder paste onto each of a first upper surface of the first semiconductor element and a second upper surface of the second semiconductor element, to form a first portion of a second solder pattern on the first upper surface and a second portion of the second solder pattern on the second upper surface;
disposing a relay board on the first portion of the second solder pattern and the second portion of the second solder pattern, the relay board having an external connection terminal attached thereto; and
performing heat treatment after the relay board is disposed, wherein
in the disposing a relay board, the relay board is disposed on the first portion of the second solder pattern with the external connection terminal interposed therebetween, and disposed on the second portion of the second solder pattern so as to come into direct contact with the second portion of the second solder pattern,
the first portion of the second solder pattern and the second portion of the second solder pattern are formed to have an identical thickness such that an upper surface of the first portion of the second solder pattern is lower in height than an upper surface of the second portion of the second solder pattern,
the first portion of the first solder pattern and the second portion of the first solder pattern are formed to have an identical thickness, and
the external connection terminal starts from a portion located between the relay board and the second portion of the second solder pattern, and extends beyond an end of the relay board, and further protrudes upward.

2. The method of manufacturing a power semiconductor device according to claim 1, wherein
solder containing nickel balls is used as the first solder paste or the second solder paste.

3. The method of manufacturing a power semiconductor device according to claim 1, wherein a distance between a lower surface of a first portion of the second solder pattern and an upper surface of the base plate is smaller than a distance between a lower surface of the second portion of the second solder pattern and the upper surface of the base plate.

4. A power semiconductor device comprising:

a base plate including a first conductor plate and a second conductor plate that are electrically insulated from each other;

a first semiconductor element bonded to the first conductor plate via a first portion of a first solder pattern;

a second semiconductor element bonded to the second conductor plate via a second portion of the first solder pattern, the first semiconductor element being designed to have a thickness different from a thickness of the second semiconductor element; and a relay board bonded to the first semiconductor element via a first portion of a second solder pattern and bonded to the second semiconductor element via a second portion of the second solder pattern, the relay board having an external connection terminal attached thereto, the relay board being disposed on the first portion of the second solder pattern with the external connection terminal interposed therebetween, and being directly connected to the second portion of the second solder pattern, the first semiconductor element being directly connected to the first portion of the first solder pattern, the second semiconductor element being directly connected to the second portion of the first solder pattern, the first portion of the second solder pattern and the second portion of the second solder pattern are formed to have an identical thickness such that an upper surface of the first portion of the second solder pattern is lower in height than an upper surface of the second portion of the second solder pattern, the first portion of the first solder pattern and the second portion of the first solder pattern have an identical thickness, and the external connection terminal starts from a portion located between the relay board and the second portion of the second solder pattern, and extends beyond an end of the relay board, and further protrudes upward.

5. The power semiconductor device according to claim 4, wherein the first portion of the first solder pattern and the second portion of the first solder pattern have an identical thickness.

6. The power semiconductor device according to claim 4, wherein a nickel ball is included in at least one of:

the first portion of the first solder pattern and the second portion of the first solder pattern; and the first portion of the second solder pattern and the second portion of the second solder pattern.

7. The power semiconductor device according to claim 4, wherein a distance between a lower surface of a first portion of the second solder pattern and an upper surface of the base plate is smaller than a distance between a lower surface of the second portion of the second solder pattern and the upper surface of the base plate.

* * * * *